United States Patent [19]

Kovalsky et al.

[11] 4,175,029

[45] Nov. 20, 1979

[54] APPARATUS FOR ION PLASMA COATING OF ARTICLES

[76] Inventors: Georgy A. Kovalsky, ulitsa Stroitelei 4, korpus 7, kv. 6; Jury P. Maishev, Sumskoi proezd 21, korpus 1, kv. 43; Boris A. Egorov, ulitsa Kharkovskaya 3, korpus 1, kv. 38; Jury A. Dmitriev, ulitsa Kakhovka 21, korpus 1, kv. 10, all of Moscow, U.S.S.R.

[21] Appl. No.: 887,229

[22] Filed: Mar. 16, 1978

[51] Int. Cl.[2] .......................................... C23C 15/00
[52] U.S. Cl. ................................................ 204/298
[58] Field of Search ................. 204/192R, 192 C, 298

[56] References Cited

U.S. PATENT DOCUMENTS

| | | | |
|---|---|---|---|
| 3,369,990 | 2/1968 | Hallen et al. | 204/298 |
| 3,526,584 | 9/1970 | Shaw | 204/192 |
| 3,616,452 | 10/1971 | Bessot et al. | 204/298 |

FOREIGN PATENT DOCUMENTS 2110668  9/1971  Fed. Rep. of Germany ...... 204/192 R 48-38076  11/1973  Japan ........................... 204/298

*Primary Examiner*—Aaron Weisstuch
*Attorney, Agent, or Firm*—Lackenbach, Lilling & Siegel

[57] ABSTRACT

The proposed apparatus is used to apply thin films of metals semiconductor and dielectric materials onto the surfaces of different articles.

The apparatus comprises a vacuum chamber accommodating a discharge chamber with at least a single slit in one of its walls. An electric field produces a plasma flow between an anode and a hot cathode arranged in the discharge chamber so that the hot cathode is located opposite the slit of the discharge chamber. A magnetic system produces a magnetic field extending through the hot cathode and slit perpendicular to the electric field between the anode and hot cathode. A target and an article holder are arranged on opposite sides of the plasma flow leaving the slit.

As a negative potential is applied to the target, plasma ions sputter the material of the target, which is deposited on the article, producing a thin film on its surface.

17 Claims, 6 Drawing Figures

APPARATUS FOR ION PLASMA COATING OF ARTICLES

FIELD OF THE INVENTION

The present invention relates to apparatus for producing thin films in a vacuum and, more particularly, to apparatus for ion plasma coating, wherein plasma is used as a source of ions to bombard a material to be thus sputtered.

The apparatus of this invention is especially advantageous in applying thin films of metals and semiconductor and dielectric materials (reactive sputtering) onto surfaces of different articles.

The invention can also be used for etching metal surfaces by sputtering and purifying surfaces of articles by a plasma flow.

DESCRIPTION OF THE PRIOR ART

At present there are several types of ion plasma sputtering apparatus.

The operating principle of such apparatus is based upon the removal of atoms from the surface of a material sputtered by ion bombardment.

From the viewpoint of their structural features, sputtering apparatus fall into the following three categories: diode (double-electrode), triode (three-electrode) and tetrode (four-electrode) apparatus. The latter two types are generally referred to as ion plasma apparatus or devices.

Sputtering apparatus of the diode type normally comprise a flat cathode (target) of a material to be subjected to sputtering, and a flat anode arranged opposite to and parallel with the cathode.

As a negative potential is applied to the cathode and a positive potential is applied to the anode, a self-sustained gas discharge is produced in the spacing between said cathode and anode. The discharge, in turn, produces positive ions, for example, of argon, which bombard the cathode and knock out atoms of the cathode material. Some of these atoms are deposited on articles arranged opposite to the cathode surface being sputtered. Diode apparatus operate at a pressure of 13.3 to 1.33 Pa, a voltage between the cathode and anode of up to 3,000 V, and a current density of ions, for example, of argon, of 0.5 to 1.0 mA/cm$^2$.

The rate at which films are applied onto the surfaces of articles amounts to a few hundredths of a micron per minute.

The most serious disadvantages of such apparatus are low efficiency and poor quality of coatings. These disadvantages are due to high working pressures, uncontrolled heating of articles, low rates at which coatings are applied onto surfaces, high discharge voltages, etc.

Ion plasma sputtering apparatus help to eliminate the above disadvantages. Apparatus of this type include a third electrode, i.e. a target which is made from a material to be used for coating. The ion source is the plasma of a non-self-maintained gas discharge with a hot cathode. A magnetic field is employed to increase the plasma density and the probability of working gas ionization. By applying a negative potential to the target, plasma ions are accelerated and sputtering of the target material is effected. Ion plasma sputtering apparatus operate within a pressure range of 0.133 to 0.08 Pa. The rate at which films are deposited amounts of tenths of a micron per minute. Ion plasma sputtering apparatus have a number of advantages over diode-type apparatus, including an improved film purity due to lower working pressures, high rates at which films are produced, as well as a high reproducibility and simplicity of control of film coating processes.

The known ion plasma sputtering apparatus of the tetrode type comprises a hot cathode and a plate-type anode arranged opposite the cathode. A flat target of a material to be sputtered is interposed between the hot cathode and anode parallel to the plane extending through the cathode and anode; the target's surface which is to be sputtered faces that plane.

An article, on which a film is to be applied, is arranged opposite the target on the side of its surface subjected to sputtering and on the opposite side of the plane extending through the hot cathode and the anode.

The device also includes a magnetic system which produces a magnetic field extending in the direction of the electrons' travel from the cathode to the anode along the surface of the target.

The device is accommodated in a vacuum chamber provided with openings for pumping off residual gases and supplying working gas. There are also openings accommodating leads through which voltage is applied to the cathode, the anode and the target from power sources. The same leads are used to supply cooling water to the anode and target. The cathode and target are insulated from the walls of the vacuum chamber; the anode is grounded.

The device under review operates at a pressure of 0.133 to 1.33 Pa produced by pumping a working gas, for example, argon, into the vacuum chamber evacuated to a pressure of $1.33 \times 10^{-4}$ Pa. Through the hot cathode there is passed a current whose intensity is enough for the hot cathode to reach the emission temperature. As a voltage of 200 to 500 V is applied between the hot cathode and the anode a gas discharge is produced. In the spacing between the hot cathode and the anode, the target and the article to be coated, plasma is produced which is shaped by the magnetic field into a flow passing above the target surface. The target is negatively biased from a high-voltage source. Positive ions of argon are accelerated in the direction of the target and bombard said target, knocking out atoms of its material. Some of these atoms are deposited on the surface of the article to be coated.

With a density of ion current directed to the target of 3 to 5 mA/cm$^2$, a discharge voltage of 200 V, and a discharge current of 6 to 8 A, the device under review applies metal coatings at a rate of up to 0.1 micron per minute.

A serious disadvantage of the foregoing apparatus is the fact that the discharge gap (the spacing between the hot cathode and anode) is also the zone where metal is sputtered and deposited onto the surface of an article being coated. The device does not make it possible to reduce the working pressure, which is necessary to improve the quality of films and increase the rates at which they are applied, because a decrease in the pressure in the vacuum chamber reduces the probability of ionization and discontinues the discharge.

Another disadvantage of the device under review lies in the fact that the film is contaminated by the material of the hot cathode, which is sputtered by plasma ions. The exposed hot cathode makes it impossible to carry out reactive sputtering, when a reactive gas, for example, oxygen, has to be supplied to the vacuum chamber in addition to the working gas. In such cases the life of the hot cathode is dramatically reduced.

The superposition of a magnetic field along the hot cathode and anode results in a non-uniform distribution of the plasma density above the target surface, which, in turn, results in a non-uniform sputtering of the target. The fact that the target is interposed between the cathode and anode accounts for an increase in the discharge voltage, which, in turn, reduces the life of the hot cathode and increases the probability of contamination.

The efficiency of the foregoing type of device can be raised by increasing the working pressure. However, such a solution is impractical in that it affects the quality of films.

There is also known an ion plasma sputtering device comprising a hot cathode, a flat target, an article to be coated, and a magnetic system. The target is encompassed by a U-shaped screen. The screen has a slit on the side of the hot cathode. The slit shapes the plasma flow into a band extending parallel to the target surface. The screen also serves as a discharge anode. The use of the screen reduces the contamination of the film with the hot cathode material. The shaping of the plasma flow into a band accounts for a uniform sputtering of the entire area of the target.

The partial division by the screen of the discharge zone and the zone in which films are deposited does not eliminate all the drawbacks inherent in the above device.

According to an alternative embodiment of this device, the hot cathode is encompassed by a tube-shaped screen. The hot cathode is introduced into one of the tube's ends and the other end face is provided with a slit. A plate-type anode is arranged opposite the slit. The target is interposed between the anode and hot cathode.

The magnetic system of the device produces a magnetic field which extends from the cathode towards the anode, through the slit and along the target surface.

The screening of the hot cathode sharply reduces the probability of contamination of the film with the hot cathode material.

The device under review is disadvantageous in that the target and the article to be coated, which is opposite the target, are interposed between the hot cathode and the anode, whereby the gas discharge plasma zone is also a zone where the sputtering of the target and deposition of a film coating on the article occurs. The pressure of the working gas, such as argon, in this zone is 0.133 Pa. A reduced pressure reduces the plasma density and discontinues the discharge. Thus the device makes it impossible to improve the quality of films.

Another disadvantage of the above device resides in the fact that a reactive gas, such as oxygen, interacts with the hot cathode when introduced into the vacuum chamber, and thus reduces the service life of the hot cathode.

With the large spacing between the hot cathode and the anode typical of the device under review, it is difficult to produce a discharge; furthermore, high voltage is necessary to maintain the discharge.

The foregoing disadvantage is obviated in another alternative embodiment of the device, wherein a rod-like electrode is arranged close to the hot cathode. The rod-like electrode is electrically connected to the anode, whereby the discharge voltage is somewhat reduced. Apart from this improvement, the device has all the other disadvantages which are mentioned above.

SUMMARY OF THE INVENTION

It is an object of the present invention to improve the quality of films applied onto articles.

It is another object of the invention to prolong the service life of hot cathodes incorporated in ion plasma sputtering devices.

It is still another object of the invention to increase the efficiency of ion plasma sputtering devices.

It is yet another object of the invention to expand the potentialities of ion plasma sputtering devices.

The foregoing objects are attained by providing an apparatus for ion plasma coating of articles, wherein a plasma flow is produced by an electric field between an anode and a hot cathode in a vacuum chamber, and shaped by a magnetic field produced by a magnetic system and a slitted screen arranged across the plasma flow. The apparatus also includes an article holder and a target to be subjected to sputtering. The article holder and the target are arranged on opposite sides of the shaped plasma flow. The vacuum chamber accommodates a discharge chamber insulated from said vacuum chamber, the discharge chamber having at least a single slit in its walls, the anode and hot cathode being so arranged in the discharge chamber that the hot cathode is found opposite the slit. The magnetic system produces a magnetic field extending through the cathode and slit perpendicular to the electric field between the anode and hot cathode.

Placing the hot cathode and anode in the closed discharge chamber with a slit having a certain gas conductivity makes it possible to separate the discharge and sputtering zones. This provides optimum pressure conditions for maintaining the discharge and ensures a high quality of the films.

As a result, the pressure in the discharge chamber is higher than in the sputtering zone, which makes it possible to increase the plasma density and reduce the reactive gas diffusion while producing films of dielectric materials with the use of the reactive sputtering techniques. An extremely low pressure can be produced in the sputtering zone with the aid of a high-capacity pumping system, keeping in mind that the conductivity of the discharge chamber's slit is determined by its geometry. A decrease in the working pressure in the course of applying films onto articles is necessary to increase the quality of the films and increase the rate at which the films are applied.

The overall quality, purity and adhesion of films are improved at low working pressures due to reduced gas impurities and conservation of the energy of sputtered atoms.

At reduced working pressures the rate at which films are applied is increased due to the reduced number of collisions between sputtered atoms and molecules of residual gas and an increase in the number of atoms which reach the surface of the article being coated.

The separation of the discharge and sputtering zones expands the potentialities and sphere of application of the proposed apparatus and prolongs the service life of the hot cathode in applications when reactive gases, such as oxygen, are introduced into the vacuum chamber to produce oxide films.

Arranging the anode close to the hot cathode so that the electric field between them is perpendicular to the magnetic field produced by the magnetic system makes it possible to produce plasmas by means of an arc discharge occurring in the mutually perpendicular electric and magnetic fields. This type of discharge is characterized by a limited potential drop and high discharge current, which makes it possible to increase the ion current directed to the target and thus increase the sputtering rate. The reduced energy of the ions which bombard the hot cathode accounts for a prolonged service life of the hot cathode.

According to one of the embodiments of the present invention, opposite the slit and behind the target there is arranged an electron repeller or screen which is electrically insulated from the vacuum chamber. The article holder and target are interposed between the discharge chamber and the screen.

In this case the discharge is accompanied by electron oscillation, which increases the ion current density and, consequently, the efficiency of the device.

The screen may be electrically connected to the hot cathode or the negative pole of the voltage source.

In ion plasma sputtering apparatus which use an arc discharge and d.c. power sources, the sectional uniformity of the plasma flow is dependent upon the distribution of the discharge current which is superimposed upon the cathode current. A uniform distribution of the discharge current over the length of the hot cathode accounts for a uniform distribution of plasma along the cathode, which, in turn, accounts for uniform sputtering of the target and a prolonged service life of the hot cathode.

In the proposed apparatus, a uniform discharge current distribution is due to the fact that the hot cathode is secured in at least two holders connected via ballast resistors to a d.c. voltage source. The points, at which the hot cathode is attached to the holders, divide the hot cathode into equal portions.

The use of ballast resistors in the supply circuit of the cathode and discharge is advantageous in that a change in the discharge current practically does not affect the total current distribution over the hot cathode. Besides, the ballast resistors protect the discharge power source from short-circuiting.

Accordingly to another embodiment of the invention, the discharge chamber has slits provided in its opposite walls and the device includes additional targets arranged on both sides of the discharge chamber.

Such a design of the discharge chamber makes the apparatus more economical and expands its potentialities. The targets can be made of different materials. By applying a negative potential from one or more power sources to such targets, one can apply multilayer coatings with a predetermined distribution of materials across the film.

The discharge chamber may be shaped as a ring encompassing the target and having a slit in the wall that faces the target. In such cases the shapes of the hot cathode and anode correspond to that of the discharge chamber. The target may be shaped as a cylinder arranged coaxially with the discharge chamber.

The use of a ring-shaped discharge chamber encompassing the target and of a ring-shaped hot cathode increases the effectiveness and efficiency of the apparatus due to the use of a closed-loop drift of electrons along the cathode and the possibility of enlarging the target area without increasing the diameter of the ring-shaped cathode.

According to still another embodiment of the invention, the target is shaped as a ring encompassing the discharge chamber. The latter's slit is provided in the wall facing the target.

The result is a radially diverging plasma flow which passes above the target surface. The closed-loop drift of electrons along the ring-shaped hot cathode increases the probability of ionization of the working gas, as well as the plasma density and ion current directed to the target.

BRIEF DESCRIPTION OF THE DRAWINGS

The invention will be better understood from the following detailed description of preferred embodiments thereof to be read in conjunction with the accompanying drawings, wherein.

DETAILED DESCRIPTION OF THE INVENTION

Figures 1, 2:
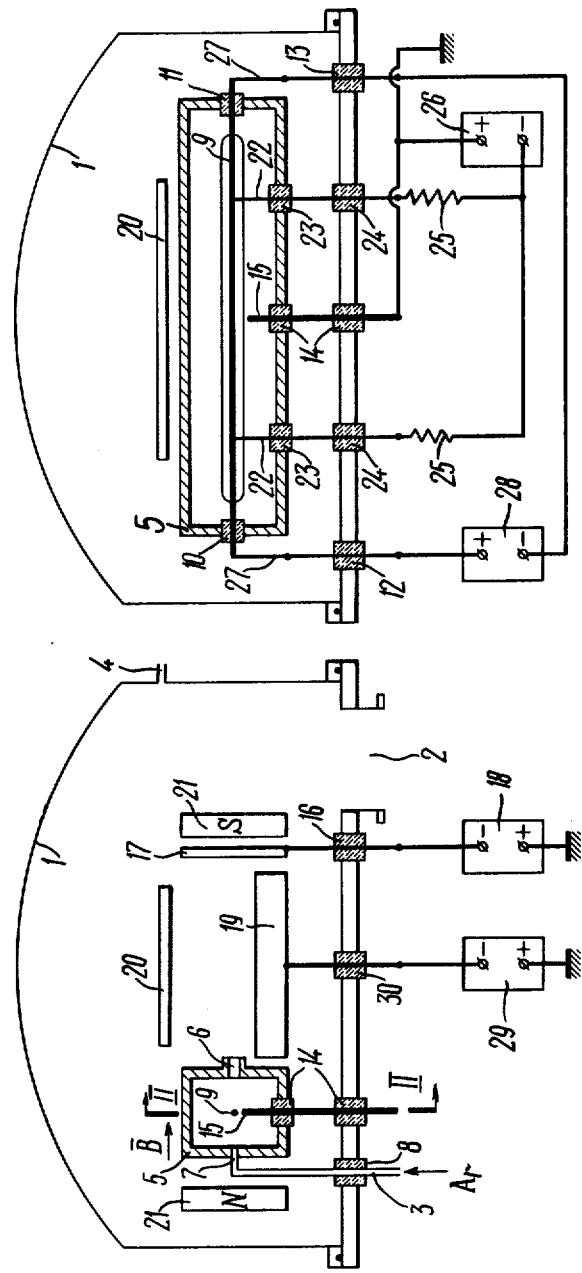
FIG. 1 is an elevational view of an ion plasma sputtering apparatus in accordance with the invention.
FIG. 2 is a cross sectional view along the line II—II of FIG. 1.

Referring to the attached drawings, the proposed apparatus for ion plasma coating of articles (FIGS. 1 and 2) comprises a vacuum chamber 1 having an evacuation opening 2 and openings 3 and 4 for ingress of working gases. The vacuum chamber 1 accommodates a closed discharge chamber 5 which is electrically insulated from the vacuum chamber 1. The discharge chamber 5 has a slit 6 and an opening 7 for ingress of a working gas. The discharge chamber 5 is insulated from the vacuum chamber 1 by means of an insulator 8. Extending inside the discharge chamber 5, along the slit 6, is a hot cathode 9 shaped as a rod or coil. The ends of the hot cathode 9 extend outside the discharge chamber 5 and are protected by insulators 10 and 11; the ends of said hot cathode 9 also extend outside the vacuum chamber 1 and are protected by insulators 12 and 13. The discharge chamber 5 further includes an insulator 14 which electrically insulates an anode 15 from the vacuum chamber 1 and the discharge chamber 5. The anode 15 is arranged in the discharge chamber 5 perpendicular to the plane extending through the hot cathode 9 and slit 6.

Opposite the slit 6, on an insulator 16 a screen or electron repeller 17 connected to a negative potential source 18, is mounted. Interposed between the discharge chamber 5 and the electron repeller 17 is a flat target 19 of a material to be used as the coating. The target 19 is arranged so that the plane extending through the hot cathode 9 and slit 6 is parallel to the surface of the target 19 which is to be sputtered. Arranged on the opposite side of that plane and opposite to the target 19 is an article holder 20. A magnetic system or source 21 is so arranged in the vacuum chamber 1 that the magnetic lines of the magnetic field it produces extend through the hot cathode 9, the slit 6 and along the target 19; the hot cathode 9 and slit 6 being found on the same magnetic line. The magnetic field produced by the magnetic system 21 extends perpendicular to the electric field between the hot cathode 9 and the anode 15. The intensity of the magnetic field in the middle of the target 19 is 250 to 300 oersteds. The magnetic system 21 may be located outside the vacuum chamber 1. The hot cathode is secured in holders 22 (FIG. 2) whose ends are insulated from the discharge chamber 5 and the vacuum chamber 1 by insulators 23 and 24. The holders 22 are coupled via ballast resistors 25 to the negative pole of a voltage source 26.

The resistance $R_k$ of any ballast resistor 25 is calculated by the formula:

$$R_k = \frac{2(n+1)U_aI_aR_o - U_kI_kR_o - 2kU_k[2U_a - U_k(n+1)]}{I_a[2(n+1)U_a - (2k+1)U_k]},$$

where k is the serial number of a ballast resistor 25, i.e. $k = 1, 2, 3, \ldots$;

$U_a$ is the discharge voltage between the anode 15 and the hot cathode 9 measured in volts;

$I_a$ is the discharge current measured in amperes;

$R_o$ is the resistance of the hot cathode 9 measured in ohms;

$I_k$ is the heating current of the hot cathode 9 measured in amperes;

$U_k$ is the heating voltage of the hot cathode 9 measured in volts, and n is the number of equal portions into which the hot cathode 9 is divided by the holders 22.

To eliminate short-circuiting of portions of the hot cathode 9 by the ballast resistors 25, the resistance of the hot cathode 9 must be two orders greater than that of its portion between the holders 22. Applied to the hot cathode 9 through leads 27 is voltage from a source 28. A negative bias potential is applied to the target 19 from a source 29. The target 19 is insulated from the vacuum chamber 1 by an insulator 30.

The target 19, the discharge chamber 5, the electron repeller 17, the leads 27 of the hot cathode 9, and the ends of the holders 22 are all water-cooled (the water cooling system is not shown in FIG. 1).

Prior to the start of operation, an article to be coated is installed in the holder 20 at a distance of 70 to 100 mm from the target 19. Through the opening 3, the apparatus is connected to a system for supplying a working gas, such as argon (the system is not shown). Also connected to the apparatus is the water-cooling system (not shown) for cooling the discharge chamber 5, the target 19, the anode 15 and the screen 17.

A pressure of about $1.3 \times 10^{-4}$ Pa is produced in the vacuum chamber 1 with the aid of such conventional evacuation means as a diffusion pump or a turbomolecular drag pump. The hot cathode 9, preferably made from tungsten and having a diameter of 2 mm, is then heated with direct current of about 150 A, supplied by the source 28, until the emission temperature is reached.

Argon is let into the discharge chamber 5 through the opening 7 until the pressure in the vacuum chamber 1 is 2.6 to $5.4 \times 10^{-2}$ Pa; the evacuation rate of the vacuum chamber 1 is about 1,000 liters per second. As a result, the pressure in the discharge chamber 5 is maintained at about 0.2 Pa. The power source 26 is activated and a discharge voltage of 50 to 80 V is applied between the hot cathode 9 and anode 15.

Between the hot cathode 9 and anode 15 there is produced an electric field which accelerates electrons emitted by the hot cathode 9 in the direction of the anode 15. The electrons acquire enough energy to ionize the argon. Collisions of the electrons with argon molecules produce plasma. The discharge voltage is spontaneously reduced, and a discharge current appears, indicating that an arc discharge has been produced in the discharge chamber 5. The discharge current is passed through the ballast resistors 25 and holders 22 and is uniformly distributed over the portions of the hot cathode 9, whereby the hot cathode 9 is uniformly heated.

Due to the presence of the mutually perpendicular electric and magnetic fields, the electrons in the discharge chamber 5 follow complex helical paths, which increases the probability of ionization and the plasma density.

The plasma produced in the discharge chamber 5 (in the discharge zone) diffuses through the slit 6 along the magnetic lines of the field generated by the magnetic system 21 towards the target 19 and the holder 20 (the sputtering zone).

The slit 6 shapes the plasma into a band-like flow which passes parallel to the surface of the target 19 to be sputtered and is spaced at a distance of 10 to 15 mm from that surface. Upon reaching the electron repeller 17, which possesses a small negative potential, the electrons are reflected therefrom and follow the magnetic lines in the opposite direction. Thus the plasma electrons oscillate between the hot cathode 9 and the electron repeller 17 until they reach the anode 15 or the wall of the vacuum chamber 1. The oscillation of the electrons accounts for additional ionization in the sputtering zone, which increases the gas efficiency of the apparatus, which means that a set amount of argon produces a greater discharge current and a greater ion current directed at the target 19 than in a conventional apparatus.

The apparatus of this invention can do without the electron repeller 17, in which case the plasma diffuses towards the walls of the vacuum chamber 1.

In order to coat an article installed in the holder 20, a negative potential of 500 to 2,000 V is applied to the target 19 from the source 29.

As this takes place, the positive ions of the band-shaped plasma flow are accelerated towards the target 19 and bombard its surface, knocking out atoms from its material. Some of these atoms are deposited on the surface of the article, producing a thin film. The rate at which the film is applied onto the surface of the article is determined by the density of the ion current directed to the target 19 and by the working pressure. At a density of current directed to the target 19 of about 20 mA/cm$^2$ and a pressure of 5.4 to $6.7 \times 10^{-2}$ Pa, the deposition rate of copper, for example, may be about 1 micron per minute.

The pressure in the sputtering zone is determined by the geometrical dimensions of the slit 6 and the rate of evacuation of the vacuum chamber 1; with a constant conductivity of the slit 6, the pressure in this zone can only be reduced by increasing the evacuation rate. For example, if the slit 6 has a width of 10 cm, a height of 0.5 cm and a depth of 1.0 cm, at an evacuation rate of 2,000 to 3,000 liters per second the pressure in the sputtering zone is $10^{-3}$ Pa.

Thus the proposed ion plasma sputtering apparatus is advantageous in that the discharge and sputtering zones are separated, which accounts for a low working pressure in the sputtering zone and a high density of ions directed at the target 19. These factors, in turn, account for a high quality of the films and a superior efficiency of the apparatus. Besides, the separation of the discharge and sputtering zones makes it possible to carry out reactive sputtering, using chemically active gases, without reducing the service life of the hot cathode 9. In such cases, in addition to argon, a reactive gas, such as oxygen, is supplied through the opening 4. As a result, on the surface of the article there is produced a film on oxide the material of the target 19.

Figure 3:
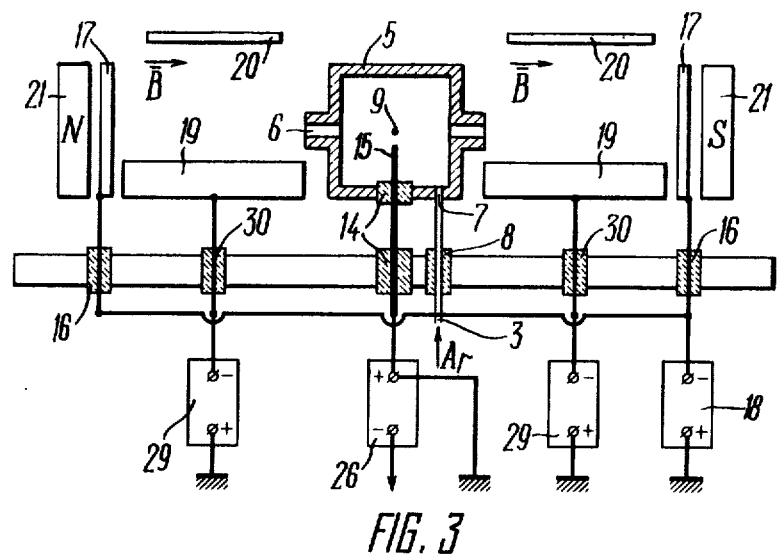
FIG. 3 is an elevational view of another embodiment of the proposed ion plasma sputtering apparatus.

FIG. 3 shows an embodiment of the apparatus, in accordance with the invention, wherein the discharge chamber 5 has slits 6 provided in opposite walls of the discharge chamber 5 so that the slits 6 and the hot cathode 9 are found on the same magnetic line of the field produced by the magnetic system 21. At least one target 19 is arranged on each side of the discharge chamber 5. Each target 19 may be connected to an individual power source 29.

The plasma, which is produced by the electric discharge between the anode 15 and hot cathode 9, is shaped by the slits 6 into a band-like flow. The plasma flow moves from the hot cathode 9 through the slits 6 and diffuses in opposite directions along the magnetic lines towards the targets 19. The targets 19 are sputtered by applying thereto a negative potential from the power sources 29.

This embodiment is advantageous because of an effective utilization of the plasma and an increased coating rate. Furthermore, this version of the proposed apparatus makes it possible to produce multilayer coatings by using targets 19 of different materials.

Figure 4:
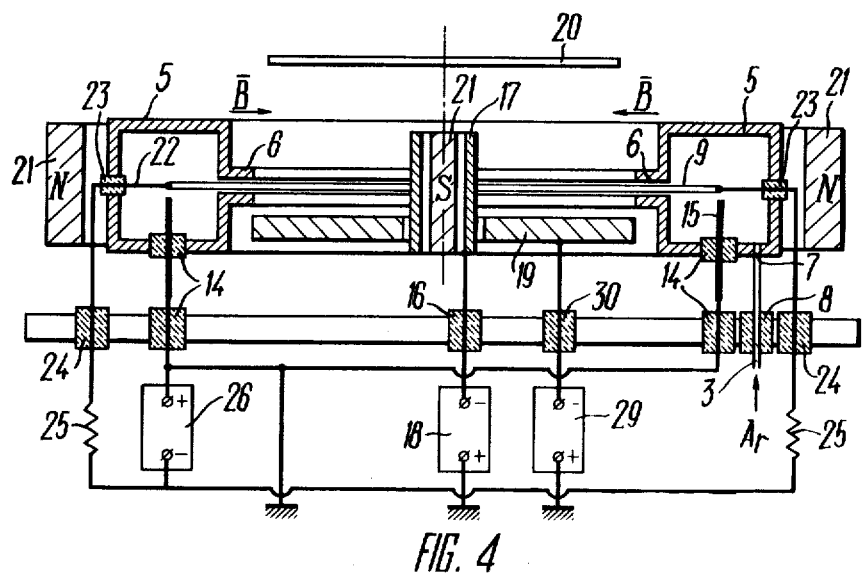
FIG. 4 is a side, elevational view of an embodiment with a ring-shaped discharge chamber.
Figure 5:
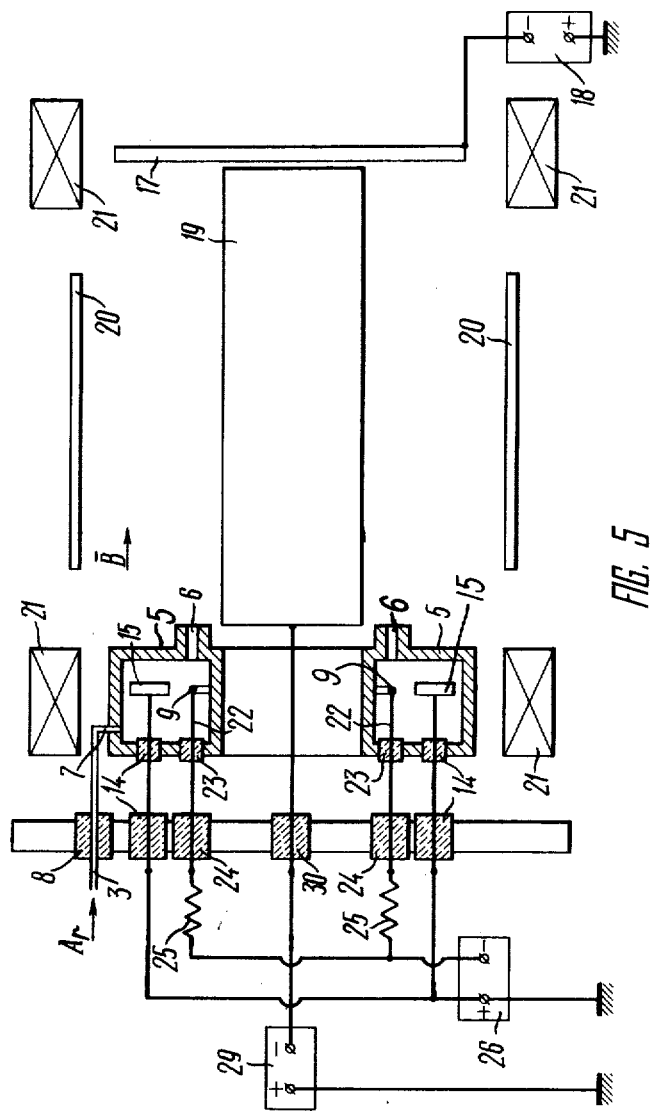
FIG. 5 is an elevational view of an embodiment with a ring-shaped discharge chamber and a cylindrical target.
Figure 6:
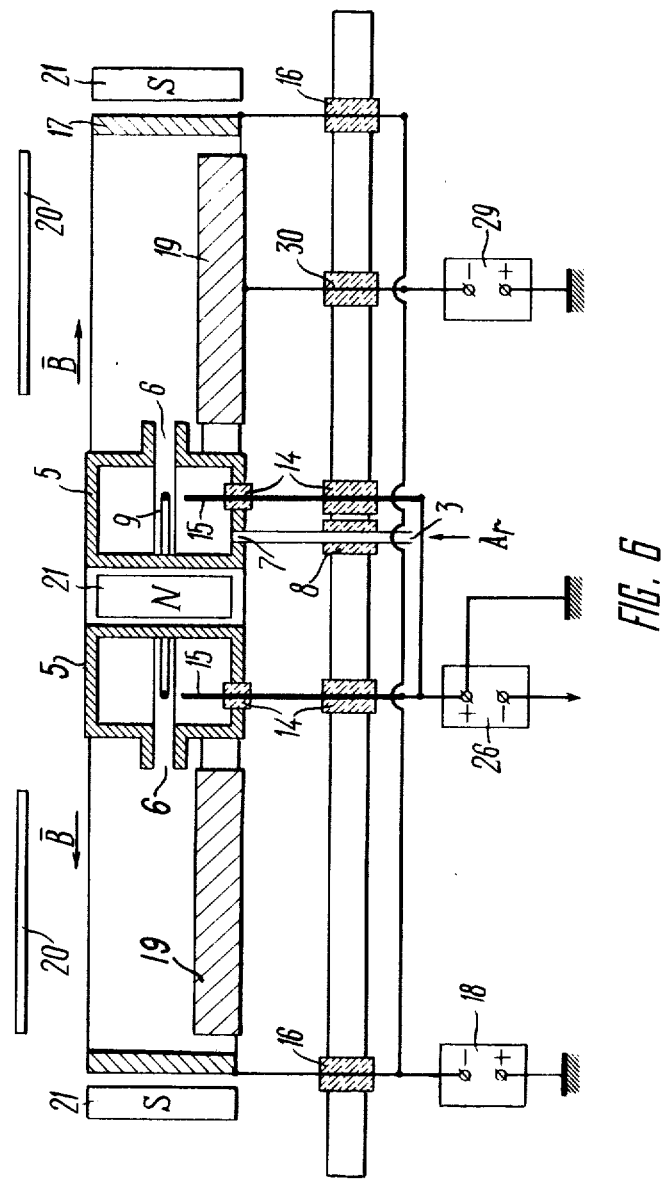
FIG. 6 is an elevational view of an embodiment with a ring-shaped discharge chamber encompassed by a ring-shaped target.

In the embodiments of FIGS. 4, 5 and 6, the discharge chamber 5 is ring-shaped. The cross-sectional shapes of the chamber 5 may be different; the discharge chamber 5 may be rectangular in section for example. A slit 6 is provided in the wall of the discharge chamber 5, which faces the target 19. The target 19 may be shaped as a ring (FIGS. 4 and 6) or a cylinder (FIG. 5).

The discharge chamber 5 accommodates a ring-shaped hot cathode 9 and a ring-shaped anode 15 arranged so that the electric field between them, produced by applying voltage from the source 26 via the ballast resistors 25, extends perpendicular to the magnetic field produced by the magnetic system 21.

The embodiments of FIGS. 4, 5 and 6 are advantageous in that they produce a closed-loop drift of electrons along the ring-shaped hot cathode 9, which increases the probability of ionization of the working gas, and also increases the plasma density and the intensity of ion current directed to the target 19. In the embodiment of FIG. 5, wherein the target 19 is shaped as a cylinder, the efficiency can be improved by increasing the length of the target 19 without increasing the diameter of the hot cathode 9.

Operation of the embodiments of FIGS. 4, 5 and 6 is similar to that of the embodiment of FIG. 1 which is described above. The differences only consist in the way the plasma flow is shaped. In the embodiment of FIG. 4, a radially converging plasma flow is produced. In the embodiment of FIG. 5, a tubular plasma flow is produced, which encompasses the target 19. In the embodiment of FIG. 6, a radially diverging plasma flow is produced, which passes above the surface of the target 19.

What is claimed is:

1. An apparatus for ion plasma coating of articles, wherein a plasma flow is produced by an electric field between an anode and a hot cathode in a vacuum chamber, comprising: a discharge chamber accommodated in said vacuum chamber and having at least a single slit provided in one of the walls of said discharge chamber, said anode and hot cathode being so arranged in said discharge chamber that the hot cathode is opposite said slit; a target to be subjected to sputtering and a holder of said articles to be coated arranged in said vacuum chamber on opposite sides of the plasma flow; a magnetic system to produce a magnetic field extending through said hot cathode and said slit of the discharge chamber perpendicular to said electric field between said hot cathode and anode; and an electron repeller arranged opposite the slit of the discharge chamber, the article holder and target being interposed between the discharge chamber and the electron repeller.

2. An apparatus as claimed in claim 1, further comprising a negative potential source connected to the electron repeller.

3. An apparatus as claimed in claim 2, further comprising a negative potential source connected to said target.

4. An apparatus as claimed in claim 1, wherein the discharge chamber has slits provided in opposite walls, the apparatus including additional targets arranged on both sides of the discharge chamber.

5. An apparatus according to claim 4, further comprising an additional electron repeller, one of said electron repellers being provided on each side of said discharge chamber.

6. An apparatus as claimed in claim 1, wherein the hot cathode is secured by at least two holders uniformly spaced over the length of the hot cathode and electrically insulated from the discharge chamber; and further comprising a voltage source having a positive pole connected to the anode and a negative pole connected via ballast resistors to free ends of the hot cathode holders.

7. An apparatus as claimed in claim 1, wherein the discharge chamber is shaped as a ring encompassing the target, the shapes of the hot cathode and anode corresponding to that of the discharge chamber, the slit of the discharge chamber being provided in the wall of the discharge chamber facing the target.

8. An apparatus as claimed in claim 7, wherein the target is shaped as a cylinder arranged coaxially with the discharge chamber.

9. An apparatus as claimed in claim 1, wherein the target is shaped as a ring encompassing the discharge chamber, the slit of the discharge chamber being provided in the wall of the discharge chamber facing the target.

10. An apparatus for ion plasma coating of articles, wherein a plasma flow is produced by an electric field between an anode and a hot cathode in a vacuum chamber, said anode and said hot cathode being positioned perpendicular to each other, comprising: a discharge chamber accommodated in an electrically insulated from said vacuum chamber and having at least a single slit provided in one of the walls of said discharge chamber, said anode and hot cathode being so arranged in said discharge chamber that the hot cathode is opposite and in the same plane as said slit; a target to be subjected to sputtering and a holder of said articles to be coated arranged in said vacuum chamber on opposite sides of the plasma flow; a magnetic system to produce a magnetic field extending through said hot cathode and said slit of the discharge chamber perpendicular to said electric field between said hot cathode and anode, said magnetic field being directed along the plane passing through said hot cathode and said slit; and an electron repeller positioned in said vacuum chamber opposite said slit.

11. An apparatus as claimed in claim 10, further comprising a voltage source having a positive terminal connected to said anode and a negative terminal connected to said hot cathode.

12. An apparatus as claimed in claim 11, wherein the hot cathode is secured by at least two holders uniformly spaced over the length of the hot cathode and electrically insulated from the discharge chamber, said negative terminal of said voltage source being connected via ballast resistors to free ends of the hot cathode holders.

13. An apparatus as claimed in claim 12, wherein the target and the discharge chamber are each shaped as a ring, the target encompassing the discharge chamber, the slit being provided in the wall of the discharge chamber facing the target and the magnetic system producing a radially converging magnetic field.

14. An apparatus as claimed in claim 11 wherein slits are provided in opposite walls of the discharge chamber; and further comprising an additional target to be sputtered made of a different material than said target, one of said targets being positioned on each side of said discharge chamber near a respective slit.

15. An apparatus as claimed in claim 11, further comprising two additional voltage sources having their negative terminals respectively connected to said electron repeller and said target.

16. An apparatus as claimed in claim 10, wherein the target and the discharge chamber are each shaped as a ring, the target encompassing the discharge chamber, the slit being provided in the wall of the discharge chamber facing the target and the magnetic system producing a radially converging magnetic field.

17. An apparatus as claimed in claim 16, wherein the target is shaped as a cylinder arranged coaxially with the discharge chamber, the magnetic system producing an axially symmetrical field around the target.

* * * * *